United States Patent [19]
Hoenlein et al.

[11] Patent Number: 5,365,405
[45] Date of Patent: Nov. 15, 1994

[54] MULTI-CHIP MODULE

[75] Inventors: Wolfgang Hoenlein, Unterhaching; Volker Lehmann, Munich, both of Germany

[73] Assignee: Siemens Aktiengesellschaft, Munich, Germany

[21] Appl. No.: 64,235

[22] Filed: May 21, 1993

[30] Foreign Application Priority Data

Jun. 10, 1992 [DE] Germany .............................. 4219031

[51] Int. Cl.$^5$ .............................................. H05K 1/16
[52] U.S. Cl. ................................... 361/766; 361/738; 361/760; 361/761; 174/255
[58] Field of Search ............... 361/766, 736, 738, 748, 361/749, 760, 761; 174/52.4, 255; 257/666, 678

[56] References Cited

U.S. PATENT DOCUMENTS

| | | | |
|---|---|---|---|
| 4,947,286 | 8/1990 | Kaneko | 361/321 |
| 5,018,051 | 5/1991 | Yamada | 361/393 |

FOREIGN PATENT DOCUMENTS 63-259730  4/1990  Japan .

*Primary Examiner*—Leo P. Picard
*Assistant Examiner*—Young Whang
*Attorney, Agent, or Firm*—Hill, Steadman & Simpson

[57] ABSTRACT

A multi-chip module has a carrier (21) of monocrystalline silicon whose surface is at least partially enlarged by anodic electro-chemical etching in a fluoride-containing acidic electrolyte. At least one capacitor (23) that has a dielectric layer and a conductive layer is arranged on the enlarged surface of the carrier (21), whereby the carrier (21) and the conductive layer act as capacitor electrodes.

16 Claims, 2 Drawing Sheets

MULTI-CHIP MODULE

BACKGROUND OF THE INVENTION

The present invention is directed to a multi-chip module. This is an arrangement having electronic components that is increasingly used for space-saving and cost-saving construction of LSI electronic components. In such an arrangement, different electronic components, particularly digital and analog integrated circuits that are partially realized on different substrates such as silicon or gallium arsenide, are arranged on a carrier together with passive components. The electronic components are rigidly joined to the carrier and are electrically connected to one another according to the planned application. For example, the carriers can be formed of silicon or ceramic.

Capacitors having capacitances in the range of lnF to 10 $\mu$F are required for analog integrated circuits and for decoupling digital integrated circuits from disturbances on supply lines. Capacitors having this range of capacitance cannot be integrated in the integrated circuits.

In prior art multi-chip module concepts, the capacitors are therefore arranged on the carrier as discrete capacitor components. The capacitor elements are usually used in SMD format. This solution is cost-involved and space-consuming and also requires that the capacitors cannot be placed arbitrarily close to the integrated circuits. Further, the discrete capacitor components have a considerably greater structural height than the integrated circuits and therefore limit the minimum structural height of the arrangement.

SUMMARY OF THE INVENTION

It is an object of the present invention to provide a multi-chip module that has a capacitor with a high specific capacitance, but that can nonetheless be realized with reduced structural height.

In general terms the present invention is a multi-chip module, having a carrier of monocrystalline silicon whose surface is enlarged at least partially by electro-chemical etching in a fluoride-containing acidic electrolyte, wherein the carrier is connected as an anode. At least one capacitor is arranged on the enlarged surface. The capacitor has a dielectric layer that is arranged on the enlarged surface and a conductive layer that is arranged on the dielectric layer, whereby the carrier and the conductive layer act as capacitor electrodes.

The arrangement inventively has a capacitor that is realized on a mono-crystalline silicon substrate whose surface is enlarged at least in the region of the capacitor on the basis of an electrochemical etching in a fluoride-containing acidic electrolyte in which the silicon substrate is connected as an anode. As a result of the electro-chemical etching, the surface of the silicon substrate is structured in a characteristic way. Holes arise, these being more or less regularly arranged dependent on the pretreatment of a substrate and having a high aspect ratio up into the range of approximately 1:400. Capacitors having a high specific capacitance can be realized on such a surface by depositing a dielectric layer and a conductive layer as cooperating electrode. Such capacitors on a silicon base typically have specific capacitances of 10 $\mu$FV/mm$^3$. A capacitor having 10 $\mu$F and 10V nominal voltage can therefore be realized on an area of approximately 10 mm$^2$ given an aspect ratio of 1:400.

The carrier is inventively composed of mono-crystalline silicon. The surface of the carrier is thereby at least partially enlarged by electro-chemical etching in a fluoride-containing acidic electrolyte wherein the carrier is connected as an anode. The capacitor is realized in the carrier in the region of the enlarged surface. It lies in the framework of the present invention to thereby define the size of the capacitor with the geometry of the conductive layer. It thereby becomes possible to arrange other electronic components at least partially above the capacitor. A space-saving arrangement is thereby enabled.

It also lies within the framework of the invention that a part of the surface of the carrier is not enlarged and that terminals for contacting the chip are arranged in this part of the surface of the carrier. As a result thereof, a lateral separation of terminals and capacitors is achieved.

For the electrical connection of the capacitor and the integrated circuit, it lies within the framework of the invention to provide a metallization at the surface of the carrier. The substrate with the integrated circuit is thus arranged at the surface of the carrier such that it at least partially overlaps the metallization. A low-impedance electrical connection between the individual electronic components is possible in this way. Such an arrangement can be produced by flip-chip assembly.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

Figure 1:
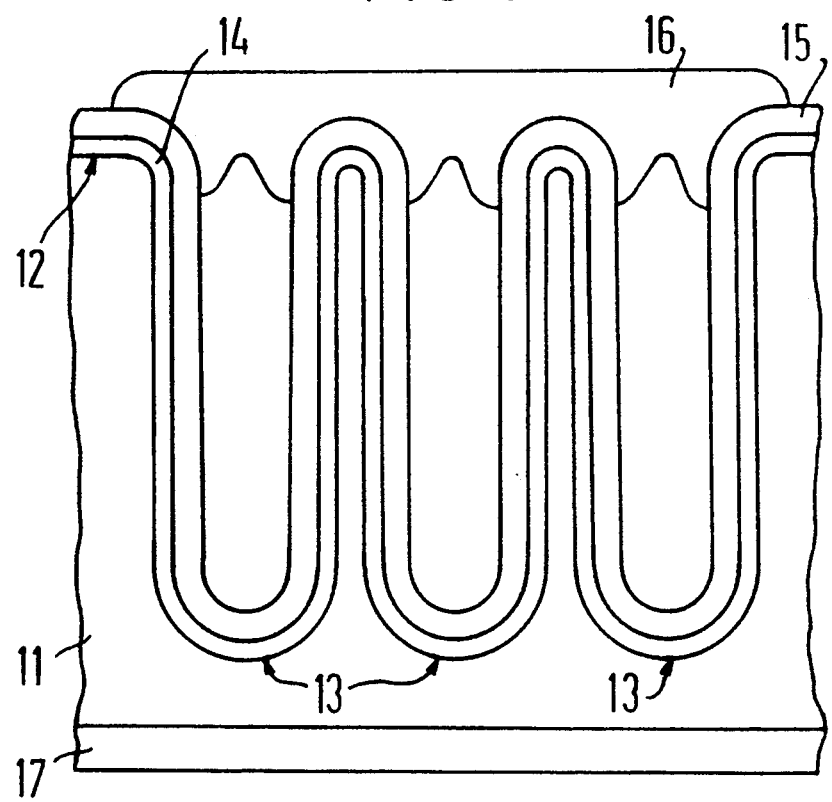
FIG. 1 shows a capacitor that is realized on a monocrystalline silicon substrate whose surface is enlarged by anodic electro-chemical etching in a fluoride-containing acidic electrolyte.

A capacitor is set forth with reference to FIG. 1, this capacitor being realized on a monocrystalline silicon substrate whose surface is enlarged at least in the region of the capacitor by electro-chemical etchings in a fluoride-containing acidic electrolyte in which the silicon substrate is connected as anode.

A substrate 11 of n-doped, monocrystalline silicon that has a specific resistance of, for example, 5 ohm.cm is provided with a plurality of hole opening 13 at a surface 12. The hole openings 13 have a diameter of, for example, 3 $\mu$m and a depth of, for example, 200 $\mu$m. The hole openings 13 are formed by electro-chemical etching. For example, 6% hydrofluoric acid (HF) is used as an electrolyte. The n-doped substrate as an anode is charged to a potential of 3 volts. The substrate is illuminated proceeding from the back side. A current density of, for example, 10 milliamperes/cm² is set. The surface 12 is in contact with the electrolyte in the electro-chemical etching. After approximately 150 minutes etching time, the hole openings 13 have a depth of 200 μm.

The surface of the hole openings 13 and the surface 12 remaining therebetween is uniformally covered with a dielectric layer 14. For example, the dielectric layer 14 is composed of SiO₂ and has a thickness of, for example, 92 nm. A conductive layer 15 is arranged on the dielectric layer 14. The conductive layer 15 is contacted, for example, of n-doped polysilicon. The conductive layer 15 completely covers the dielectric layer 14. The conductive layer 15 is compacted by a first contact 16. The first contact 16 is composed of, for example, of aluminum. Due to the surface tension of the aluminum, the first contact 16 is composed of a continuous layer that contacts only the upper part of the conductive layer 15 in the region of the hole openings 13. The conductive layer of the substrate 11 acts as capacitor electrodes in the capacitor. A second contact 17 of, for example, aluminum is applied on a surface of the substrate opposite the surface 12.

Figure 2:
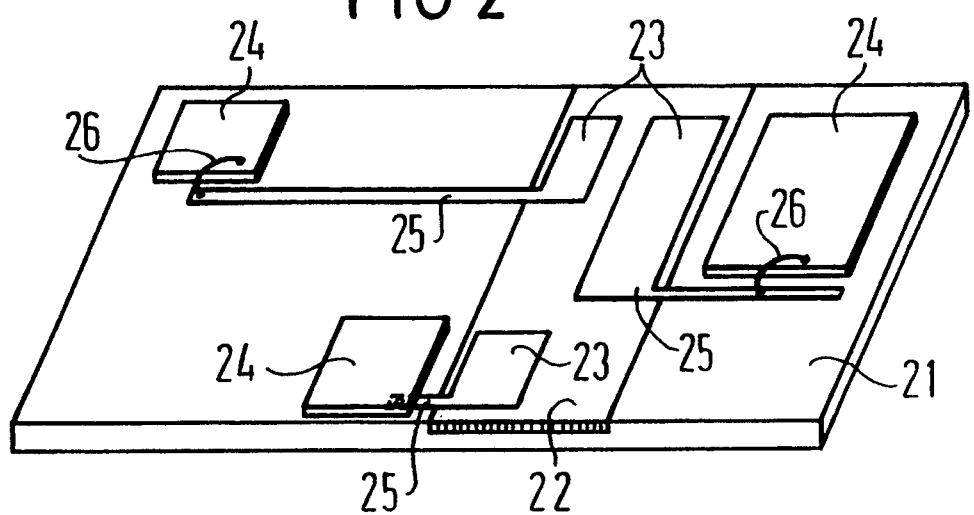
FIG. 2 is a perspective view of an arrangement having electronic components that have a carrier of monocrystalline silicon whose surface is partially enlarged by anodic electrochemical etching.

A carrier 21 of monocrystalline silicon (see FIG. 2) has a region 22 in the surface wherein the surface is enlarged by electro-chemical etching in a fluoride-containing acidic electrolyte, the carrier being connected as the anode. Capacitors 23 are realized in this region 22. The size of the capacitors 23 is thereby defined by the geometry of a conductive layer that acts as a capacitor electrode. Electronic components, for example, circuits 24 integrated in substrates, are arranged on the carrier 21 outside the region 22. Metallizations 25 are arranged at the surface of the capacitors 23 and extend onto the surface of the carrier 21. The metallizations 25 thereby simultaneously form a contact to the conductive layer of the respective capacitor 23 and provide connections to the integrated circuits. These connections are realized, for example, by bond wires 26.

The electrical connection between the metallization 25 and an integrated circuit 24 can also be realized in that the integrated circuit 24 is partially arranged above the metallization 25. In this case, the contact occurs over the backside of the substrate in which the integrated circuit 24 is integrated. Such an electrical connection, for example, can be realized by flip chip assembly.

Figure 3:
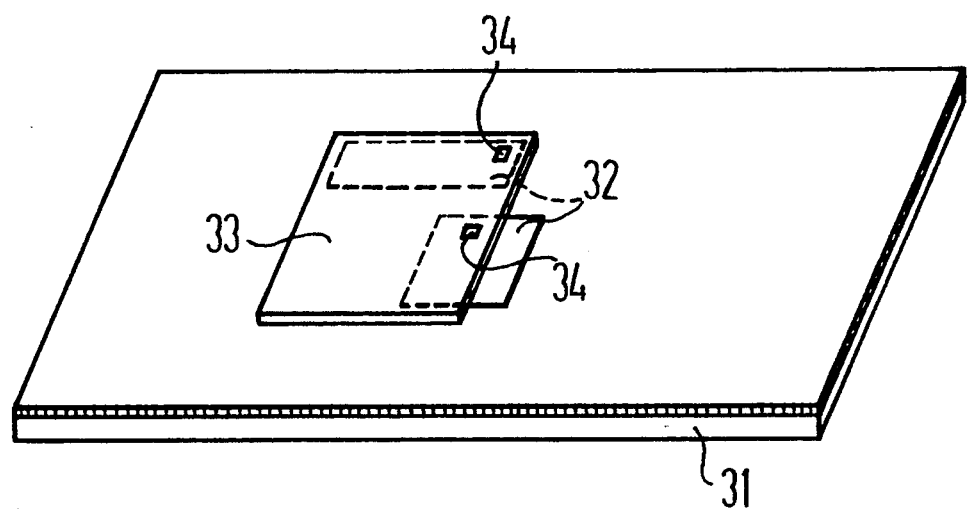
FIG. 3 is a perspective view of an arrangement having electronic components having a carrier of monocrystalline silicon whose surface is continuously enlarged by anodic electro-chemical etching and in whose surface at least one capacitor is realized.

In another exemplary embodiment (See FIG. 3), a carrier 31 of monocrystalline silicon is employed whose surface is provided with a hole structure and thereby enlarged on the basis of an anodic electrical chemical etching in a fluoride-containing acidic electrolyte. Capacitors 32 are realized in the surface, their size being defined by the geometry of the conductive layer. For example, a circuit 33 integrated in a substrate is arranged on the carrier 31 as an electronic component. It can overlap the capacitors entirely or partially. An electrical connection between the integrated circuit 33 and the capacitors 32 is realized by a respective metallization 34 of the surface of the carrier 31 that contacts the substrate containing the integrated circuit 33 from the backside. This embodiment allows an extremely space-saving arrangement of capacitors and integrated circuits.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A multi-chip module, comprising:
   a carrier of monocrystalline silicon, said carrier having a surface that is at least partially enlarged by electro-chemical etching in a fluoride-containing acidic electrolyte to produce a plurality of hole openings that thereby form an enlarged surface portion of said surface, said carrier being connected as an anode; and
   at least one capacitor arranged on said enlarged surface portion, said at least one capacitor having a dielectric layer that uniformly covers a surface of the hole openings and a portion of said surface of said carrier between said hole openings, said at least one capacitor also having a conductive layer that is arranged on said dielectric layer, whereby said carrier and said conductive layer act as capacitor electrodes of said at least one capacitor.

2. The multi-chip module according to claim 1, wherein said capacitor has a size that is defined by a geometry of said conductive layer.

3. The multi-chip module according to claim 1, wherein said surface of said carrier has a region that is not enlarged and wherein the multi-chip module further comprises terminals for contacting a chip arranged in said region of said surface of said carrier.

4. The multi-chip module according to claim 1, wherein the multi-chip module further comprises:
   a metallization arranged at said surface of said carrier for electrical connection of said at least one capacitor and at least one electronic component; and
   at least one substrate having said at least one electronic component, said at least one substrate arranged on said surface of said carrier such that said at least one substrate at least partially overlaps said metallization.

5. The multi-chip module according to claim 4, wherein said at least one electronic component is at least partially arranged above said at least one capacitor.

6. A multi-chip module, comprising:
   a substrate carrier having opposed first and second surfaces;
   a predetermined portion of said first surface being enlarged, said predetermined portion of said first surface of said substrate carrier having a plurality of hole openings that thereby enlarge said predetermined portion;
   at least one capacitor arranged on said predetermined portion of said first surface, said at least one capacitor having a dielectric layer that uniformly covers a surface of the hole openings and a part of said first surface located between said hole openings, said at least one capacitor also having a conductive layer on said dielectric layer;
   wherein an upper surface of said at least one capacitor is substantially at the same level as said first surface of said carrier.

7. The multi-chip module according to claim 6, wherein said substrate carrier is composed of monocrystalline silicon and said predetermined portion is enlarged by electro-chemical etching in a fluoride-containing acidic electrolyte, said substrate carrier being connected as an anode.

8. The multi-chip module according to claim 6, wherein for said at least one capacitor, said conductive layer is a first capacitor electrode and said substrate carrier is a second capacitor electrode, a first contact being over said conductive layer and a second contact being arranged on said second side of said substrate carrier.

9. The multi-chip module according to claim 6, wherein the multi-chip module further comprises at least one electronic component arranged on said first side of said substrate carrier at least partially in an area outside of said predetermined portion, and at least one metallization electrically connecting said at least one capacitor to said at least one electronic component.

10. The multi-chip module according to claim 9, wherein said metallization extends from an upper surface of said at least one capacitor, across said first surface of said substrate carrier, to said area of said at least one electronic component.

11. The multi-chip module according to claim 9, wherein said metallization is arranged on an upper surface of said at least one capacitor and said at least one electronic component at least partially overlaps said at least one capacitor, and also overlaps and contacts said metallization.

12. A multi-chip module, comprising:
a substrate carrier having opposed first and second surfaces;
a predetermined portion of said first surface being enlarged, said predetermined portion of said first surface of said substrate carrier having a plurality of hole openings that thereby enlarge said predetermined portion;
at least one capacitor arranged on said predetermined portion of said first surface, said at least one capacitor having a dielectric layer that uniformly covers a surface of the hole openings and a part of said first surface located between said hole openings, said at least one capacitor also having a conductive layer on said dielectric layer, said at least one capacitor having an upper surface that is substantially at the same level as said first surface of said carrier;
at least one electronic component arranged on said first side of said substrate carrier at least partially in an area outside of said predetermined portion; and
at least one metallization electrically connecting said at least one capacitor to said at least one electronic component.

13. The multi-chip module according to claim 12, wherein said substrate carrier is composed of monocrystalline silicon and said predetermined portion is enlarged by electo-chemical etching in a fluoride-containing acidic electrolyte, said substrate carrier being connected as an anode.

14. The multi-chip module according to claim 12, wherein for at least one capacitor, said conductive layer is a first capacitor electrode and said substrate carrier is a second capacitor electrode, a first contact being over said conductive layer and a second contact being arranged on said second side of said substrate carrier.

15. The multi-chip module according to claim 12, wherein said metallization extends from an upper surface of said at least one capacitor, across said first surface of said substrate carrier, to said area of said at least one electronic component.

16. The multi-chip module according to claim 12, wherein said metallization is arranged on an upper surface of said at least one capacitor and said at least one electronic component at least partially overlaps said at least one capacitor, and also overlaps and contacts said metallization.

* * * * *